United States Patent
Li et al.

(10) Patent No.: US 10,503,064 B2
(45) Date of Patent: Dec. 10, 2019

(54) METHOD FOR MANUFACTURING COLOR FILTER SUBSTRATE

(71) Applicant: Shenzhen China Star Optoelectronics Semiconductor Display Technology Co., Ltd., Shenzhen (CN)

(72) Inventors: Wenjie Li, Shenzhen (CN); Shinsuke Iguchi, Shenzhen (CN)

(73) Assignee: SHENZHEN CHINA STAR OPTOELECTRONICS SEMICONDUCTOR DISPLAY TECHNOLOGY CO., LTD., Guandong (CN)

( * ) Notice: Subject to any disclaimer, the term of this patent is extended or adjusted under 35 U.S.C. 154(b) by 98 days.

(21) Appl. No.: 15/576,711

(22) PCT Filed: Nov. 9, 2017

(86) PCT No.: PCT/CN2017/110193
§ 371 (c)(1),
(2) Date: Nov. 23, 2017

(87) PCT Pub. No.: WO2019/051974
PCT Pub. Date: Mar. 21, 2019

(65) Prior Publication Data
US 2019/0086799 A1   Mar. 21, 2019

(30) Foreign Application Priority Data

Sep. 15, 2017   (CN) .......................... 2017 1 0830822

(51) Int. Cl.
*G02B 5/20* (2006.01)
*G03F 7/00* (2006.01)
(Continued)

(52) U.S. Cl.
CPC .............. *G03F 7/0007* (2013.01); *G03F 7/16* (2013.01); *H01L 27/322* (2013.01);
(Continued)

(58) Field of Classification Search
CPC .............. G03F 7/0007; G02F 1/133512; G02F 1/133514; G02F 1/133516; H01L 27/322; G02B 5/201
(Continued)

(56) References Cited

U.S. PATENT DOCUMENTS

2007/0003845 A1* 1/2007 Su ........................... G02B 5/204
430/7
2015/0253620 A1* 9/2015 Yang .................. G02F 1/133516
349/106

(Continued)

FOREIGN PATENT DOCUMENTS

CN    101008733 A    8/2007
CN    103941466 A    7/2014
(Continued)

*Primary Examiner* — John M McPherson
(74) *Attorney, Agent, or Firm* — Mark M. Friedman

(57) ABSTRACT

A method for manufacturing a color filter substrate is provided in the present disclosure, that includes providing a substrate; forming a plurality of RGB color resists on the substrate, an upper surface of each of the RGB color resists forming a plurality of light emitting regions; forming a black matrix on the surface of each of the RGB color resists, wherein the black matrix covers a portion of the surface of each of the RGB color resists except the light emitting regions; forming a plurality of photo spacers on a surface of the black matrix in a plurality of empty areas within each of the RGB color resists, wherein the adjacent photo spacers are separated by one of the color resist regions; and forming a protective layer over the substrate.

18 Claims, 3 Drawing Sheets

(51) Int. Cl.
*G03F 7/16* (2006.01)
*H01L 27/32* (2006.01)
*H01L 51/52* (2006.01)

(52) U.S. Cl.
CPC ...... *H01L 51/5237* (2013.01); *H01L 51/5284* (2013.01); *G02B 5/201* (2013.01)

(58) Field of Classification Search
USPC .............................................. 430/7; 359/106
See application file for complete search history.

(56) References Cited

U.S. PATENT DOCUMENTS

| | | | |
|---|---|---|---|
| 2015/0331161 A1* | 11/2015 | Wang | H01L 51/52 359/513 |
| 2016/0131937 A1* | 5/2016 | Yang | G02F 1/1368 349/42 |
| 2016/0370633 A1 | 12/2016 | Byeon et al. | |
| 2017/0038630 A1 | 2/2017 | Chen et al. | |
| 2017/0097540 A1* | 4/2017 | Kim | G02F 1/133509 |
| 2017/0254935 A1* | 9/2017 | Shinsuke | G02B 5/201 |

FOREIGN PATENT DOCUMENTS

| | | |
|---|---|---|
| CN | 105044967 A | 11/2015 |
| CN | 105739185 A | 7/2016 |

\* cited by examiner

METHOD FOR MANUFACTURING COLOR FILTER SUBSTRATE

FIELD OF THE INVENTION

The present disclosure relates to a technical field of displays, and particularly to method for manufacturing a color filter substrate.

BACKGROUND OF THE INVENTION

Organic light emitting diodes (OLEDs) have been widely used due to advantages such as good self-luminous characteristics, superior contrast, fast response time, and flexible display.

Full color is implemented from the OLEDs in several manners, such as (a) using three organic light emitting materials in red, green, and blue to emit light directly; (b) using white organic light emitting diode (WOLED) and color filter (CF); and (c) using a light color conversion method cooperated with a blue light emitting layer and a light color conversion layer.

In current OLEDs, CF design of OLEDs requires CF design methodology of a liquid crystal display (LCD). The CF is required to realize a full color display of an LCD. A color filter substrate 1 generally includes a black matrix (BM) 12, RGB color resists 13, a protective layer 14, and photo spacers (PS) 15; a specific structure is as shown in FIG. 1.

In current OLEDs structures, the photo spacers 15 are located over the protective layer 14, thus distance between the WOLED and the color filter substrate 1 is easily increased, resulting in risk of color mixing. In addition, the photo spacers 15 are generally made of organic photoresists that present a color in light yellow and have a certain translucence.

SUMMARY OF THE INVENTION

An object of the present disclosure is to provide a method for manufacturing a color filter substrate, which can reduce a thickness of a color filter substrate and improve color mixing problems occurring from light passing through a color filter substrate, so as to improve the display quality of a display device.

According to an aspect of the present disclosure, a method for manufacturing a color filter substrate is provided in the present disclosure, which includes the following steps:
a step S10 of providing a substrate;
a step S20 of forming a plurality of RGB color resists on the substrate, wherein each of the RGB color resists comprises at least four color resist regions arranged in an array, each of color resist regions comprises a first color resist block, a second color resist block, and a third color resist block distributed in sequence, an upper surface of each of the RGB color resists comprises a plurality of light emitting regions, wherein the first color resist block is a red color resist block, the second color resist block is a green color resist block, the third color resist block is a blue color resist block;
a step S30 of forming a black matrix on the surface of each of the RGB color resists, wherein the black matrix covers a portion of the surface of the RGB color resists except the light emitting regions;
a step S40 of forming a plurality of photo spacers on a surface of the black matrix in a plurality of empty areas within each of the RGB color resists, wherein the adjacent photo spacers are separated by one of the color resist regions; and
a step S50 of forming a protective layer over the substrate, wherein the protective layer fully covers the black matrix, the photo spacers, and the RGB color resists;
wherein a complementary arrangement of the photo spacers combined with the black matrix is configured to prevent light emitted from the RGB color resists from being mixed.

According to a preferred embodiment of the present disclosure, the substrate is a rigid substrate or a flexible substrate.

According to a preferred embodiment of the present disclosure, the material of the black matrix is one of organic photoresist, opaque metal, metal oxide, and metal nitride.

According to a preferred embodiment of the present disclosure, the material of the black matrix is organic photoresist, wherein the black matrix is formed by disposing the organic photoresist on the portion of the surface of each of the RGB color resists except the light emitting regions using nozzle printing technology or ink-jet printing technology.

According to a preferred embodiment of the present disclosure, the material of the black matrix is opaque metal or metal oxide, wherein the black matrix is formed by disposing the opaque metal or the metal oxide on the portion of the surface of each of the RGB color resists except the light emitting regions using thermal evaporation technology or magnetron sputtering technology.

According to a preferred embodiment of the present disclosure, a length of the photo spacers is the same as a length of each of the RGB color resists.

According to a preferred embodiment of the present disclosure, the material of the photo spacers is one of black frame sealant, opaque metal, metal oxide, metal nitride, and transparent organic light emitting diode (OLED) packaging frame sealant.

According to a preferred embodiment of the present disclosure, the material of the photo spacers is organic photoresist, wherein the black matrix is formed by disposing the organic photoresist on the surface of the black matrix in the empty areas within each of the RGB color resists using nozzle printing technology or ink-jet printing technology.

According to a preferred embodiment of the present disclosure, the photo spacers are formed by coating organic solvent, wherein the photo spacers are formed by curing the organic solvent while the organic solvent is coated.

According to another aspect of the present disclosure, a method for manufacturing a color filter substrate is provided in the present disclosure, which includes the following steps:
a step S10, providing a substrate;
a step S20, forming a plurality of RGB color resists on the substrate, wherein each of the RGB color resists comprises at least four color resist regions in an array distribution, each of the color resist regions comprises a first color resist block, a second color resist block, and a third color resist block distributed in sequence, an upper surface of each of the RGB color resists comprises a plurality of light emitting regions;
a step S30, forming a black matrix on the surface of each of the RGB color resists, wherein the black matrix covers a portion of the surface of the RGB color resists except the light emitting regions;
a step S40, forming a plurality of photo spacers on a surface of the black matrix in a plurality if empty areas of each of the RGB color resists, wherein the adjacent photo spacers are separated by one of the color resist regions; and a step S50, forming a protective layer over the substrate, wherein the protective layer fully covers the black matrix, the photo spacers, and the RGB color resists;
wherein a complementary arrangement of the photo spacers combined with the black matrix is configured to prevent light emitted from the RGB color resists from being mixed.

According to a preferred embodiment of the present disclosure, the substrate is a rigid substrate or a flexible substrate.

According to a preferred embodiment of the present disclosure, the material of the black matrix is one of organic photoresist, opaque metal, metal oxide, and metal nitride.

According to a preferred embodiment of the present disclosure, the material of the black matrix is organic photoresist, wherein the black matrix is formed by disposing the organic photoresist on the portion of the surface of each of the RGB color resists except the light emitting regions using nozzle printing technology or ink-jet printing technology.

According to a preferred embodiment of the present disclosure, the material of the black matrix is opaque metal or metal oxide, wherein the black matrix is formed by disposing the opaque metal or the metal oxide on the portion of the surface of the RGB color resists except the light emitting regions using thermal evaporation technology or magnetron sputtering technology.

According to a preferred embodiment of the present disclosure, a length of the photo spacers is the same as a length of each of the RGB color resists.

According to a preferred embodiment of the present disclosure, the material of the photo spacers is one of black frame sealant, opaque metal, metal oxide, metal nitride, and transparent organic light emitting diode (OLED) packaging frame sealant.

According to a preferred embodiment of the present disclosure, the material of the photo spacers is organic photoresist, wherein the black matrix is formed by disposing the organic photoresist on the surface of the black matrix in the empty areas within each of the RGB color resists using nozzle printing technology or ink-jet printing technology.

According to a preferred embodiment of the present disclosure, the photo spacers are formed by coating organic solvent, wherein the photo spacers are formed by curing the organic solvent while the organic solvent is coated.

A method for manufacturing the color filter substrate is provided in the present disclosure, that can reduce a thickness of a color filter substrate and improve color mixing problems occurring from light passing through a color filter substrate, so as to improve display quality of a display device, by improving designs of the black matrix and the color spacers.

BRIEF DESCRIPTION OF THE DRAWINGS

In order to more clearly illustrate the technical solutions in the embodiments or the prior art, the following drawings, which are intended to be used in the description of the embodiments or the prior art, will be briefly described. It will be apparent that the drawings described below are merely disclosures in some embodiments, it will be apparent to those skilled in the art that other drawings may be obtained from these drawings without departing from the creative work.

DETAILED DESCRIPTION OF THE PREFERRED EMBODIMENTS

Figure 1:
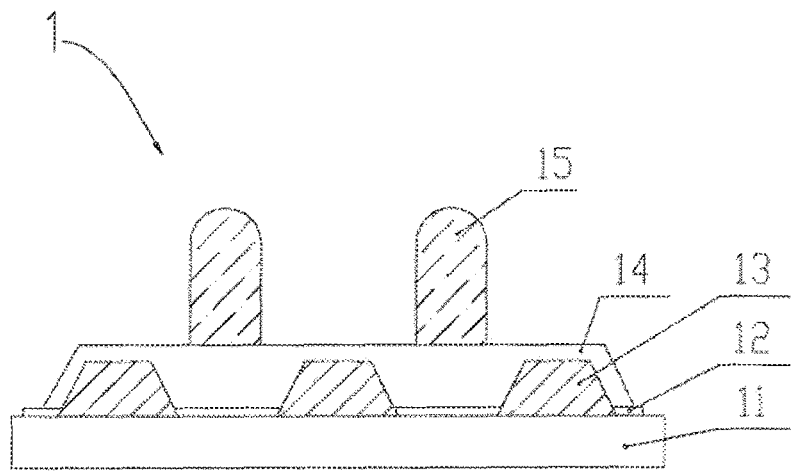
FIG. 1 is a schematic view of a structure of a color filter substrate in the prior art.

The following description of each embodiment refers to the appended drawings for illustrating specific embodiments in which the present disclosure may be practiced. Directional terms as mentioned in the present disclosure, such as "up", "down", "front", "post", "left", "right", "inside", "outside", "lateral", etc., are merely used for the purpose of illustrating and understanding the present disclosure and are not intended to be limiting of the present disclosure. In the drawings, units with similar structures are denoted by the same reference numerals.

Figure 2:
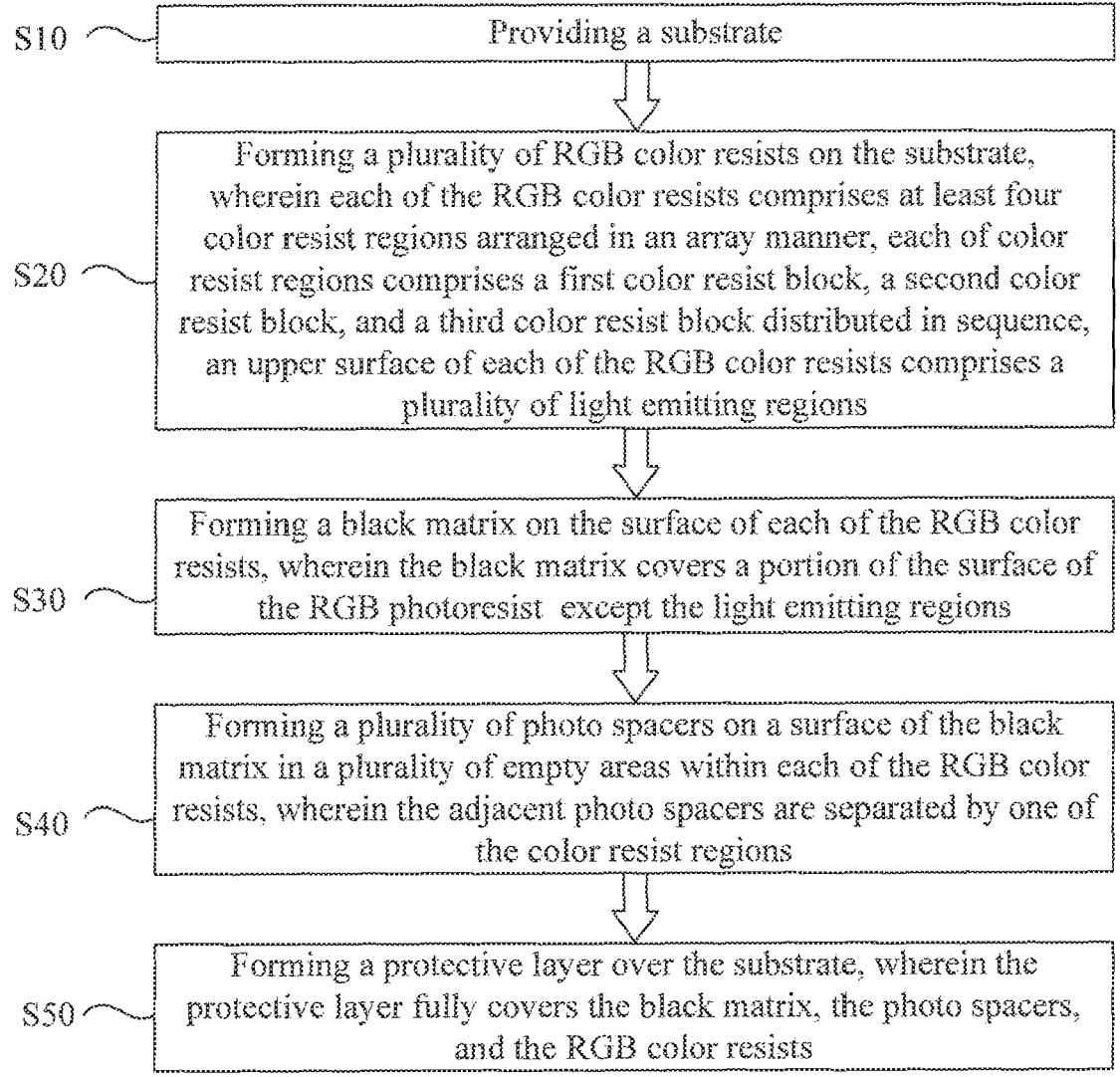
FIG. 2 is a flowchart for manufacturing a color filter substrate according to an embodiment of the present disclosure.
Figure 3:
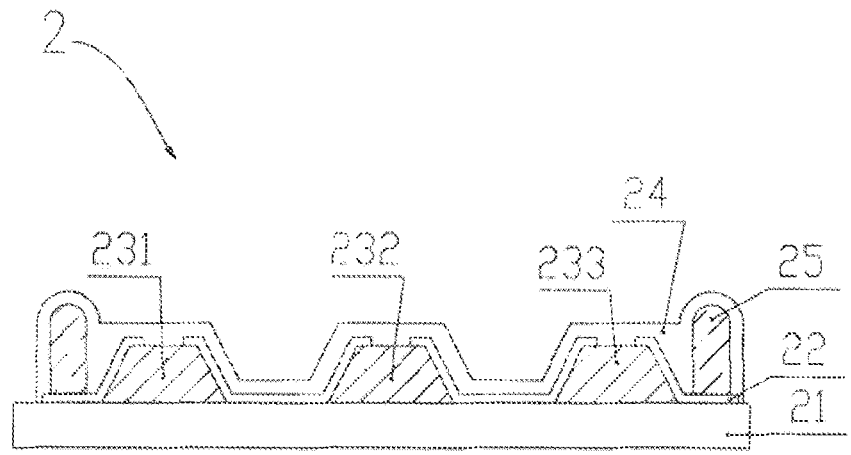
FIG. 3 is a schematic view of a structure of the color filter substrate according to an embodiment of the present disclosure.
Figure 4A:
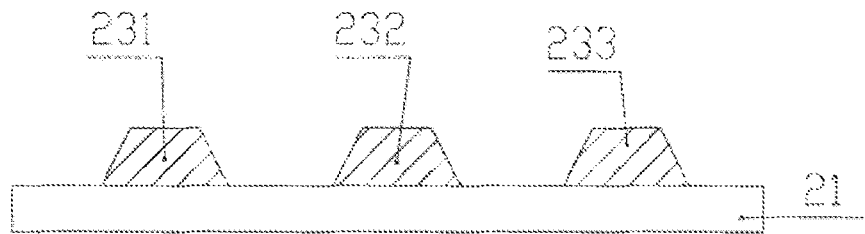
FIG. 4a to 4d are schematic views of the structure for manufacturing the color filter substrate according to an embodiment of the present disclosure.

The present disclosure will now be described in further detail with reference to the accompanying drawings and specific examples:

As shown in FIG. 2, a method for manufacturing a color filter substrate 2 is provided in the present disclosure, and includes the following steps:

As shown in FIG. 4a, a step S10 of providing a substrate 21;

Wherein the substrate 21 may be a rigid substrate such as a glass substrate, or may be a flexible substrate such as polyimide film.

A step S20 of forming a plurality of RGB color resists 23 on the substrate, wherein each of the RGB color resists comprises at least four color resist regions arranged in an array manner, each of color resist regions comprises a first color resist block 231, a second color resist block 232, and a third color resist block 233 distributed in sequence, an upper surface of each of the RGB color resists 23 comprises a plurality of light emitting regions.

Wherein the first color resist block is a red color resist block, the second color resist block is a green color resist block, the third color resist block is a blue color resist block.

The step S20 is to form RGB color resists 23 patterned on the surface of the substrate 21 by processes such as coating, pre-baking, exposure, developing, and re-baking. Each of the RGB color resists 23 may be form by dispersing an RGB pigment in an organic solvent, or may be an RGB quantum dot material.

The coating method of the RGB color resists 23 may be applied by slit coating or spin coating; and the shape of each of the RGB color resists 23 is the same as the shape of a pixel.

Figure 4B:
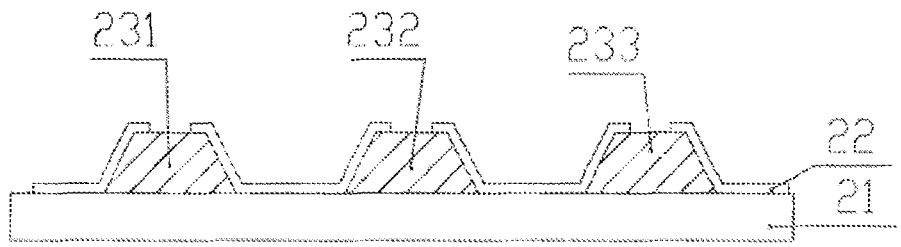

As shown in FIG. 4b, a step S30 of forming a black matrix 22 on the surface of each of the RGB color resists 23, wherein the black matrix 22 covers a portion of the surface of each of the RGB color resists 23 except the light emitting regions.

Wherein the light emitting regions of each of the RGB color resists 23 is located at the upper surface region of each of the RGB color resists 23. The black matrix 22 covers the surface of the RGB color resists 23, with a plurality of empty areas within each of the RGB color resists 23 covered by the black matrix 22.

The material of the black matrix 22 is one of organic photoresist, opaque metal, metal oxide, and metal nitride, that is able to block the light through or reflect the light back.

While the material of the black matrix 22 is an organic photoresist, the black matrix 22 is formed by a technology such as dispensing, screen printing, nozzle printing, ink-jet printing, and the like.

While the material of the black matrix 22 is a metal or a metal oxide, the black matrix 22 is formed by a process such as thermal evaporation, magnetron sputtering, vapor deposition, and the like.

Figure 4C:
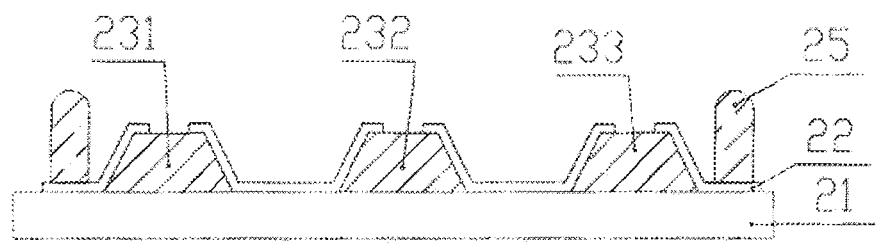

As shown in FIG. 4c, a step S40 of forming a plurality of photo spacers 25 on a surface of the black matrix 22 in empty areas within each of the RGB color resists 23, wherein the adjacent photo spacers 25 are separated by one of the color resist regions;

In the step S40, a horizontal length of one of the photo spacers 25 is the same as a length of a longest side of each of the RGB color resists 23, because a color mixing phenomenon of the color filter substrate 2 mainly occurs in a long side region of the pixel.

The material of the photo spacers 25 is one of black frame sealant, opaque metal, metal oxide, metal nitride, and transparent organic light emitting diode (OLED) packaging frame sealant.

While the material of the photo spacers 25 is an organic photoresist, the photo spacers 25 is formed by a technology, such as dispensing, screen printing, nozzle printing, ink-jet printing, and the like; in addition, the photo spacers 25 is formed by coating an organic solvent, the organic solvent is solidified while coating the organic solvent.

While the material of the photo spacers 25 is a metal or a metal oxide, the black matrix 22 is formed by a process such as thermal evaporation, magnetron sputtering, vapor deposition, and the like.

Figure 4D:
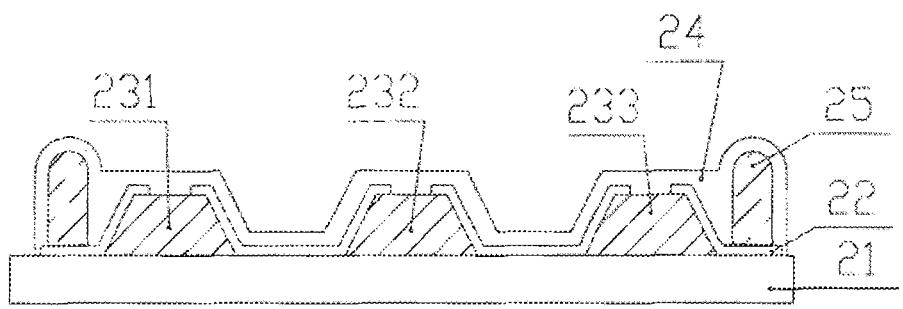

As shown in FIG. 4d, a step S50, forming a protective layer 24 over the substrate 21, wherein the protective layer 24 fully covers the black matrix 22, the photo spacers 2, and the RGB color resists 23.

The present disclosure is achieved by the photo spacers 25 combined with the black matrix 22 in a complementary arrangement to prevent a problem of color mixing of light emitted from the RGB color resists 23.

The protective layer 24 is capable of providing effects of isolating between a encapsulated high transmittance organic filler and the RGB color resists 23, as well as isolating of organic photoresist gas.

In the present disclosure, the protective layer 24 serves as a buffer layer, thus is also referred to as the buffer layer. The protective layer 24 is a dense oxide film, preferably as one or at least two of silicon oxide, silicon nitride and aluminum oxide.

The protective layer 24 may be formed by a sputtering coating, a vapor deposition technique, or an atomic layer deposition technique.

The present disclosure is improved by designs of the black matrix and the photo spacers, that are able to reduce a thickness of a color filter substrate and improve color mixing problems occurring from light passing through a color filter substrate, so as to improve display quality of a display device.

What is claimed is:

1. A method for manufacturing a color filter substrate, comprising:
   a step S10 of providing a substrate;
   a step S20 of forming a plurality of RGB color resists on the substrate, wherein each of the RGB color resists comprises at least four color resist regions arranged in an array, each of the color resist regions comprises a first color resist block, a second color resist block, and a third color resist block distributed in sequence, an upper surface of each of the RGB color resists comprises a plurality of light emitting regions, wherein the first color resist block is a red color resist block, the second color resist block is a green color resist block, the third color resist block is a blue color resist block;
   a step S30 of forming a black matrix on the surface of each of the RGB color resists, wherein the black matrix covers a portion of the surface of each of the RGB color resists except the light emitting regions;
   a step S40 of forming a plurality of photo spacers on a surface of the black matrix in a plurality of empty areas within each of the RGB color resists, wherein the adjacent photo spacers are separated by one of the color resist regions; and
   a step S50 of forming a protective layer over the substrate, wherein the protective layer fully covers the black matrix, the photo spacers, and the RGB color resists;
   wherein a complementary arrangement of the photo spacers combined with the black matrix is configured to prevent light emitted from the RGB color resists from being mixed.

2. The method for manufacturing the color filter substrate as claimed in claim 1, wherein the substrate is a rigid substrate or a flexible substrate.

3. The method for manufacturing the color filter substrate as claimed in claim 1, wherein the material of the black matrix is one of organic photoresist, opaque metal, metal oxide, and metal nitride.

4. The method for manufacturing the color filter substrate as claimed in claim 3, wherein the material of the black matrix is organic photoresist, wherein the black matrix is formed by disposing the organic photoresist on the portion of the surface of each of the RGB color resists except the light emitting regions using nozzle printing technology or ink-jet printing technology.

5. The method for manufacturing the color filter substrate as claimed in claim 3, wherein the material of the black matrix is opaque metal or metal oxide, wherein the black matrix is formed by disposing the opaque metal or the metal oxide on the portion of the surface of each of the RGB color resists except the light emitting regions using thermal evaporation technology or magnetron sputtering technology.

6. The method for manufacturing the color filter substrate as claimed in claim 1, wherein a length of the photo spacers is the same as a length of each of the RGB color resists.

7. The method for manufacturing the color filter substrate as claimed in claim 1, wherein the material of the photo spacers is one of black frame sealant, opaque metal, metal oxide, metal nitride, and transparent organic light emitting diode (OLED) packaging frame sealant.

8. The method for manufacturing the color filter substrate as claimed in claim 1, wherein the material of the photo spacers is organic photoresist, wherein the photo spacers are formed by disposing the organic photoresist on the surface of the black matrix in the empty areas within each of the RGB color resists using nozzle printing technology or ink-jet printing technology.

9. The method for manufacturing the color filter substrate as claimed in claim 1, wherein the photo spacers are formed by coating organic solvent, wherein the photo spacers are formed by curing the organic solvent while the organic solvent is coated.

10. A method for manufacturing a color filter substrate, comprising:
- a step S10, providing a substrate;
- a step S20, forming a plurality of RGB color resists on the substrate, wherein each of the RGB color resists comprises at least four color resist regions in an array distribution, each of the color resist regions comprises a first color resist block, a second color resist block, and a third color resist block distributed in sequence, an upper surface of the RGB color resist comprises a plurality of light emitting regions;
- a step S30, forming a black matrix on the surface of each of the RGB color resists, wherein the black matrix covers a portion of the surface of each of the RGB color resists except the light emitting regions;
- a step S40, forming a plurality of photo spacers on a surface of the black matrix in a plurality of empty areas within each of the RGB color resists, wherein the adjacent photo spacers are separated by one of the color resist regions; and
- a step S50, forming a protective layer over the substrate, wherein the protective layer fully covers the black matrix, the photo spacers, and the RGB color resists;

wherein a complementary arrangement of the photo spacers combined with the black matrix is configured to prevent light emitted from the RGB color resists from being mixed.

11. The method for manufacturing the color filter substrate as claimed in claim 10, wherein the substrate is a rigid substrate or a flexible substrate.

12. The method for manufacturing the color filter substrate as claimed in claim 10, wherein the material of the black matrix is one of organic photoresist, opaque metal, metal oxide, and metal nitride.

13. The method for manufacturing the color filter substrate as claimed in claim 12, wherein the material of the black matrix is organic photoresist, wherein the black matrix is formed by disposing the organic photoresist on the portion of the surface of each of the RGB color resists except the light emitting regions by adopting nozzle printing technology or ink-jet printing technology.

14. The method for manufacturing the color filter substrate as claimed in claim 12, wherein the material of the black matrix is opaque metal or metal oxide, wherein the black matrix is formed by disposing the opaque metal or the metal oxide on the portion of the surface of each of the RGB color resists except the light emitting regions using thermal evaporation technology or magnetron sputtering technology.

15. The method for manufacturing the color filter substrate as claimed in claim 10, wherein a length of the photo spacers is the same as a length of each of the RGB color resist.

16. The method for manufacturing the color filter substrate as claimed in claim 10, wherein the material of the photo spacers is one of black frame sealant, opaque metal, metal oxide, metal nitride, and transparent organic light emitting diode (OLED) packaging frame sealant.

17. The method for manufacturing the color filter substrate as claimed in claim 10, wherein the material of the photo spacers is organic photoresist, wherein the photo spacers are formed by disposing the organic photoresist on the surface of the black matrix in the empty areas within each of the RGB color resists using nozzle printing technology or ink-jet printing technology.

18. The method for manufacturing the color filter substrate as claimed in claim 10, wherein the photo spacers are formed by coating organic solvent, wherein the photo spacers are formed by curing the organic solvent while the organic solvent is coated.

* * * * *